United States Patent

Hong

(10) Patent No.: US 10,748,626 B2
(45) Date of Patent: *Aug. 18, 2020

(54) DATA STORAGE DEVICE AND OPERATING METHOD THEREOF

(71) Applicant: SK hynix Inc., Gyeonggi-do (KR)

(72) Inventor: Jiman Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/521,313

(22) Filed: Jul. 24, 2019

(65) Prior Publication Data

US 2019/0348136 A1 Nov. 14, 2019

Related U.S. Application Data

(63) Continuation of application No. 15/895,539, filed on Feb. 13, 2018, now Pat. No. 10,403,376.

(30) Foreign Application Priority Data

Jun. 27, 2017 (KR) ........................ 10-2017-0081301

(51) Int. Cl.
| | |
|---|---|
| *G11C 16/34* | (2006.01) |
| *G11C 16/26* | (2006.01) |
| *G11C 16/04* | (2006.01) |
| *G11C 16/08* | (2006.01) |
| *G11C 16/24* | (2006.01) |
| *G11C 11/56* | (2006.01) |

(52) U.S. Cl.
CPC .......... *G11C 16/3404* (2013.01); *G11C 16/26* (2013.01); *G11C 16/3459* (2013.01); *G11C 11/5621* (2013.01); *G11C 16/0483* (2013.01); *G11C 16/08* (2013.01); *G11C 16/24* (2013.01)

(58) Field of Classification Search
None
See application file for complete search history.

(56) References Cited

U.S. PATENT DOCUMENTS

| 10,403,376 B2 * | 9/2019 | Hong | ........................ | G11C 16/26 |
| 2017/0062057 A1 * | 3/2017 | Yang | ........................ | G11C 16/22 |
| 2018/0052638 A1 * | 2/2018 | You | ........................ | G11C 16/16 |

* cited by examiner

*Primary Examiner* — Tan T. Nguyen
(74) *Attorney, Agent, or Firm* — IP & T Group LLP

(57) ABSTRACT

A data storage device includes a controller suitable for transmitting a search command; and a nonvolatile memory device suitable for performing an erase page search operation of searching for an erased page among a plurality of pages based on the command, and transmitting information regarding a searched page to the controller.

5 Claims, 13 Drawing Sheets

DATA STORAGE DEVICE AND OPERATING METHOD THEREOF

CROSS-REFERENCES TO RELATED APPLICATION

This application is a continuation of U.S. patent application Ser. No. 15/895,539 filed on Feb. 13, 2018, which claims benefits of priority of Korean Patent Application No. 10-2017-0081301 filed on Jun. 27, 2017. The disclosure of each of the foregoing application is incorporated herein by reference in its entirety.

BACKGROUND

1. Technical Field

Various embodiments of the present invention generally relate to a data storage device which uses a nonvolatile memory device as a storage medium.

2. Related Art

Recently, the paradigm for the computer environment has been changed into ubiquitous computing so that computer systems can be used anytime and anywhere. Due to this fact, the use of portable electronic devices such as mobile phones, digital cameras, and notebook computers has rapidly increased. In general, such portable electronic devices use a data storage device which uses a memory device for storing data to be used in the portable electronic device.

A data storage device using a memory device provides advantages in that, generally, since there is no mechanical driving part, stability and durability are excellent, information access speed is high and power consumption is small. Data storage devices having such advantages include a universal serial bus (USB) memory device, memory cards having various interfaces, a universal flash storage (UFS) device, and a solid state drive (SSD).

SUMMARY

Various embodiments are directed to a nonvolatile memory device capable of searching an erase page by itself, a data storage device including the memory device, and an operating method thereof.

In an embodiment, a data storage device may include: a controller suitable for transmitting a search command; and a nonvolatile memory device suitable for performing an erase page search operation of searching for an erased page among a plurality of pages based on the command, and transmitting information regarding a searched page to the controller.

In an embodiment, a data storage device may include: a controller suitable for transmitting a search command; and a nonvolatile memory device including a memory cell region comprising a plurality of pages, each page comprising a plurality of memory cells; a voltage generator suitable for applying a search voltage to a selected page among the plurality of pages and applying a pass voltage to unselected pages among the plurality of pages; a data read block suitable for sensing data of the selected page; and a control logic suitable for performing an erase page search operation of searching for an erase page among the plurality of pages based on the search command, and transmitting information regarding a searched page which is determined as the erase page, to the controller.

In an embodiment, a method for operating a data storage device including a nonvolatile memory device and a controller which controls the nonvolatile memory device may include: transmitting a search command to the nonvolatile memory device; searching for an erased page among pages of the nonvolatile memory device according to the search command; and transmitting information regarding a searched page which is determined as an erase page, to the controller.

In an embodiment, a method for operating a data storage device including a nonvolatile memory device and a controller which controls the nonvolatile memory device may further include: receiving an address indicating a region for search from the controller.

In an embodiment, wherein the searching of the erased page may comprise: setting a page corresponding to the address, as an initial search page, among the plurality of pages; and determining whether the initial search page is in an erase state.

In an embodiment, wherein the searching of the erased page may comprise: changing a search page according to a predetermined search sequence when it is determined that the initial search page is not in an erase state; and determining whether a changed search page is in an erase state.

In an embodiment, wherein the searching of the erased page may comprise: setting a page which is fastest in a predetermined search sequence among the plurality of pages, as an initial search page; determining whether the initial search page is in an erase state; changing a search page according to the page sequence when it is determined that the initial search page is not in an erase state; and determining whether a changed search page is in an erase state.

In an embodiment, wherein the searching of the erased page may comprise: dividing the pages into a first group and a second group; and determining first whether pages of the first group are in an erase state, and determining whether pages of the second group are in an erase state, in the case where the pages of the first group are not in an erase state.

In an embodiment, wherein the searching of the erased page may comprise: setting a page which is fastest in a predetermined search sequence in the first group, as an initial search page; and determining whether the initial search page is in an erase state.

In an embodiment, wherein the searching of the erased page may comprise: changing a search page according to the search sequence in the first group when it is determined that the initial search page is not in an erase state; and determining whether a changed search page is in an erase state.

In an embodiment, a method for operating a data storage device including a nonvolatile memory device and a controller which controls the nonvolatile memory device may further include: based on a status command from the controller, transmitting the information regarding the page searched as the erase page.

According to the embodiments, because a nonvolatile memory device may search an erase page by itself, the use of the resources of a controller which controls the nonvolatile memory device may be reduced.

DETAILED DESCRIPTION

Figure 1:
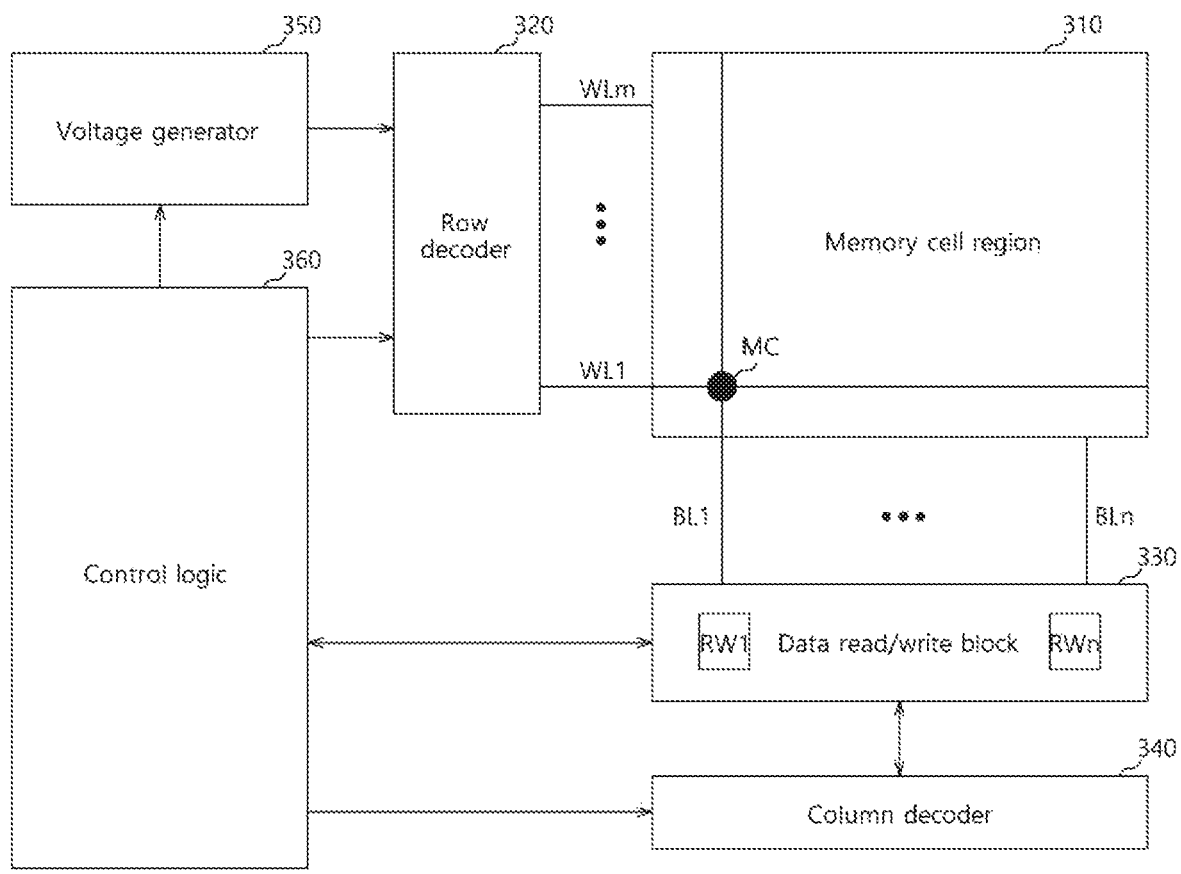
FIG. 1 is simplified block diagram illustrating an exemplary configuration of a nonvolatile memory device in accordance with an embodiment.

In the present invention, advantages, features and methods for achieving them will become more apparent after a reading of the following exemplary embodiments taken in conjunction with the drawings. The present invention may, however, be embodied in different forms and should not be construed as being limited to the embodiments set forth herein. Rather, these embodiments are provided to describe the present invention in detail to the extent that a person skilled in the art to which the invention pertains can easily enforce the technical concept of the present invention.

It is to be understood herein that embodiments of the present invention are not limited to the particulars shown in the drawings and that the drawings are not necessarily to scale and in some instances proportions may have been exaggerated in order to more clearly depict certain features of the invention. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes" and/or "including," when used in this specification, specify the presence of at least one stated feature, step, operation, and/or element, but do not preclude the presence or addition of one or more other features, steps, operations, and/or elements thereof.

Hereinafter, a data storage device and an operating method thereof will be described below with reference to the accompanying drawings through various examples of embodiments.

FIG. 1 is simplified block diagram illustrating a nonvolatile memory device 300 in accordance with an embodiment. Referring to FIG. 1, the nonvolatile memory device 300 may include a memory cell region 310, a row decoder 320, a data read/write block 330, a column decoder 340, a voltage generator 350, and a control logic 360.

The memory cell region 310 may include a plurality of memory cells MC which are arranged in rows and columns at areas where word lines WL1 to WLm and bit lines BL1 to BLn intersect with each other.

The row decoder 320 may be coupled with the memory cell region 310 through word lines WL1 to WLm. The row decoder 320 may operate according to the control of the control logic 360. The row decoder 320 may decode an address provided from an external device (not shown). The row decoder 320 may select and drive at least one of the word lines WL1 to WLm, based on a decoding result. For instance, the row decoder 320 may provide a word line voltage provided from the voltage generator 350, to the word lines WL1 to WLm.

The data read/write block 330 may be coupled with the memory cell region 310 through the bit lines BL1 to BLn. The data read/write block 330 may include read/write circuits RW1 to RWn respectively corresponding to the bit lines BL1 to BLn. The data read/write block 330 may operate according to the control of the control logic 360. The data read/write block 330 may operate as a write driver or a sense amplifier depending on an operation mode. For example, the data read/write block 330 may operate, in a write operation (or a program operation), as a write driver which stores data provided from the external device, in the memory cell region 310. For another example, the data read/write block 330 may operate, in a read operation, as a sense amplifier which senses data from the memory cell region 310.

The column decoder 340 may operate according to the control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines (or data input/output buffers), based on a decoding result.

The voltage generator 350 may generate voltages to be used in internal operations of the nonvolatile memory device 300, according to the control of the control logic 360. The voltage generator 350 may apply the generated voltages to the word lines, bit lines and well areas of the memory cells of the memory cell region 310.

The control logic 360 may control one or more operations of the nonvolatile memory device 300, based on commands, addresses and control signals provided from the external device. For example, the control logic 360 may control the read, write (or program), erase and erase page search operations of the nonvolatile memory device 300. The erase page search operation will be described below in detail.

Figure 2:
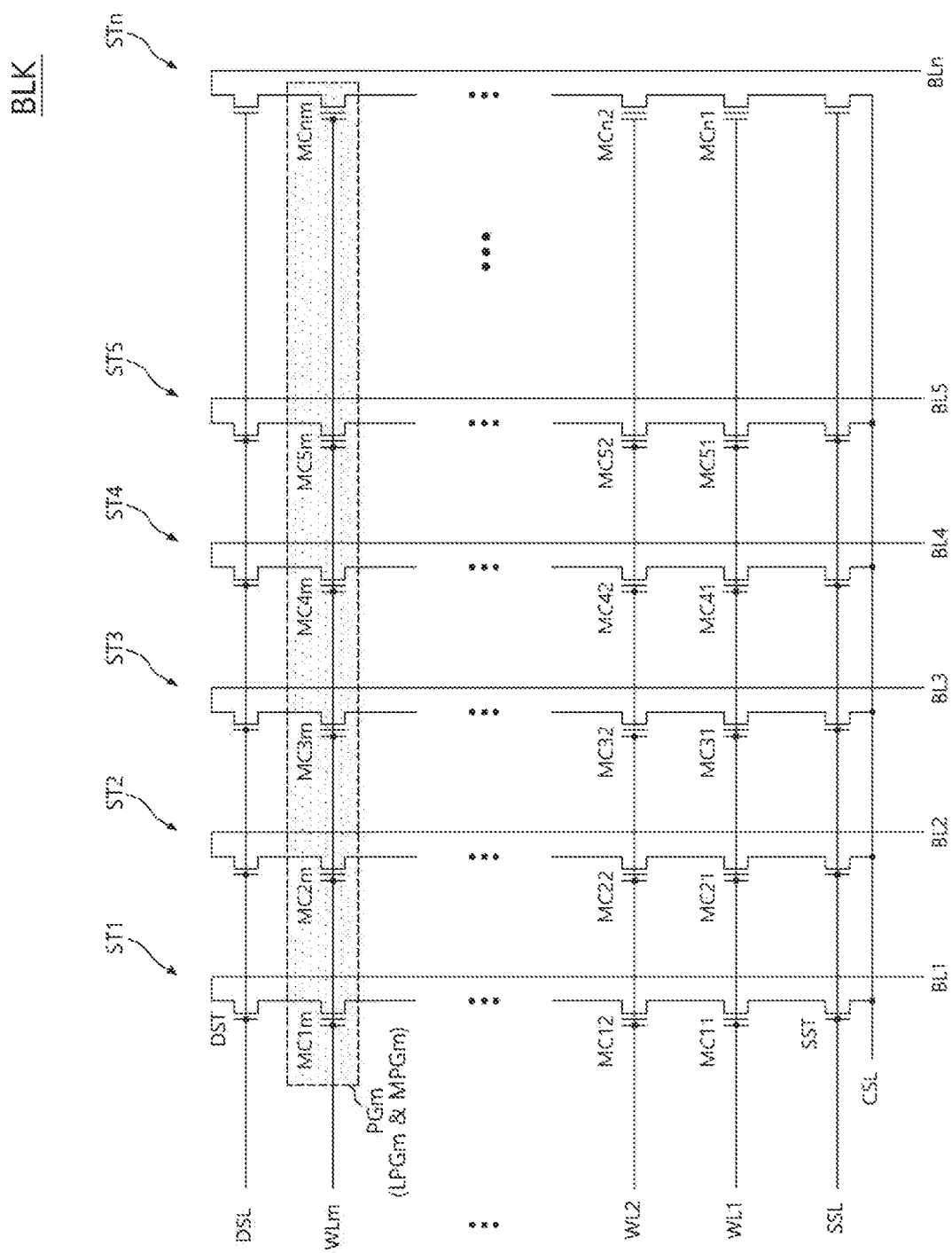
FIG. 2 is a circuit diagram illustrating an exemplary memory block constructing a memory cell region of a nonvolatile memory device in accordance with an embodiment.

FIG. 2 is a circuit diagram illustrating a memory block BLK constructing a memory cell region of a nonvolatile memory device in accordance with an embodiment, for example, the memory cell region 310 of FIG. 1. From an operational viewpoint or a physical (or structural) viewpoint, the memory cells of the memory cell region 310 of FIG. 1 may be configured by hierarchical memory cell sets or memory cell units such as memory blocks and pages. For example, memory cells which are coupled to the same word line and are to be read and written (or programmed) simultaneously may be configured as a page PG. For another example, memory cells which are to be erased simultaneously may be configured as the memory block BLK. The number of memory blocks which configure the memory cell region 310 and the number of pages PG per the memory block BLK may be changed variously.

Referring to FIG. 2, the memory block BLK may include a plurality of cell strings ST1 to STn which are coupled to a plurality of bit lines BL1 to BLn, respectively. The cell strings ST1 to STn have the same circuit configuration, and for the sake of convenience in explanation, one cell string ST1 will be described below representatively.

The cell string ST1 may include a plurality of memory cells MC11 to MC1m and drain and source select transistors DST and SST which are coupled between the bit line BL1 and a common source line CSL. In detail, the cell string ST1 may include the drain select transistor DST, the gate of which is coupled to a drain select line DSL, the plurality of memory cells MC11 to MC1m, the gates of which are respectively coupled to a plurality of word lines WL1 to WLm, and the source select transistor SST, the gate of which is coupled to a source select line SSL.

In the case where the memory cells MC1m to MCnm are single level cells, the memory cells MC1m to MCnm which are coupled to the same word line WLm may be configured as one page PGm. In the case where the memory cells MC1m to MCnm are 2-bit multi-level cells, the memory cells MC1m to MCnm which are coupled to the same word line WLm may be configured as two logical pages LPGm and MPGm. In the following descriptions, for the sake of convenience in explanation, the memory cells configured as a page PG will be referred to as a "page."

Figure 3:
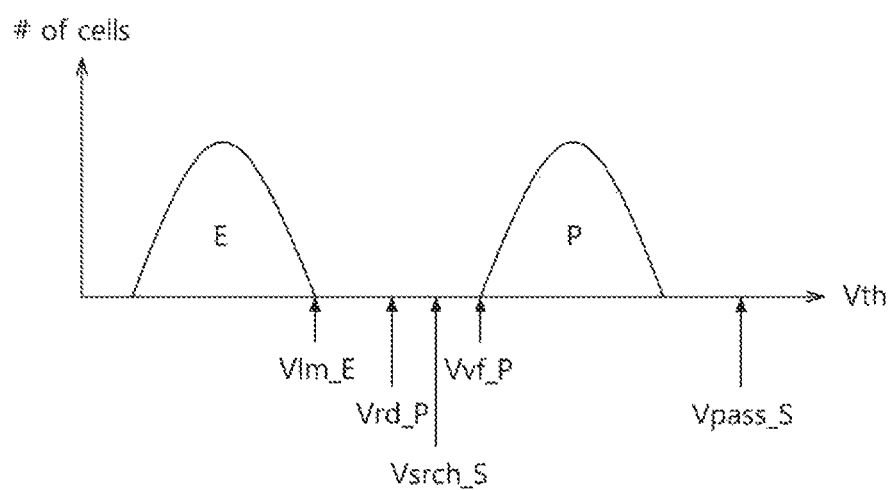
FIGS. 3 and 4 are diagrams illustrating examples of threshold voltage distributions of memory cells.
Figure 4:
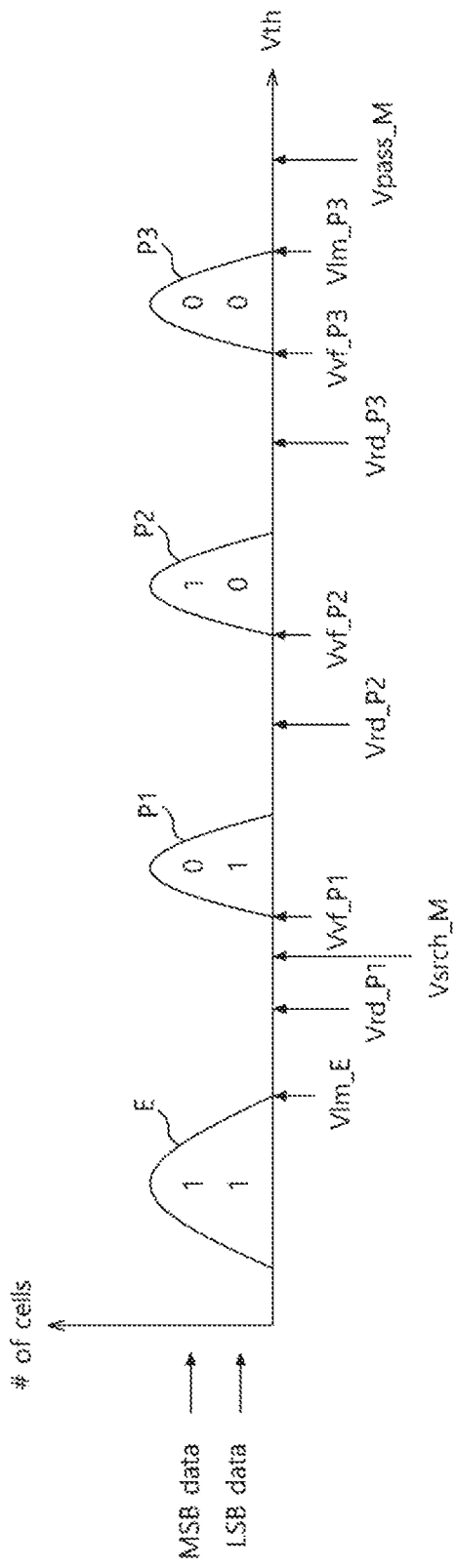

FIGS. 3 and 4 are diagrams illustrating examples of threshold voltage distributions of memory cells in accordance with an embodiment. FIG. 3 illustrates the threshold voltage distributions of single level cells, and FIG. 4 illustrates the threshold voltage distributions of 2-bit multilevel cells.

Referring to FIG. 3, single level cells each capable of storing a single data bit may be erased to have threshold voltages of an erase state E, and may be programmed to have threshold voltages of a program state P.

In a read operation, a read voltage Vrd_P having a voltage level between the erase state E and the program state P may be applied to the word line of a selected memory cell. If the read voltage Vrd_P is applied, a memory cell having a threshold voltage of the erase state E may be turned on, and be determined as a memory cell which stores data "1." Also, if the read voltage Vrd_P is applied, a memory cell having a threshold voltage of the program state P may be turned off, and be determined as a memory cell which stores data "0." In the following descriptions, a memory cell which is turned on by a voltage applied to the word line of the memory cell will be defined as an "on cell", and a memory cell which is turned off by a voltage applied to the word line of the memory cell will be defined as an "off cell".

In a program operation, in order to determine whether the program is completed, a program verify voltage Vvf_P may be applied to the word line of a selected memory cell. If the program verify voltage Vvf_P is applied, a memory cell which has a threshold voltage less than the program verify voltage Vvf_P may be determined as an on cell, that is, a memory cell of which program is not completed, and a memory cell which has a threshold voltage greater than the program verify voltage Vvf_P may be determined as an off cell, that is, a memory cell of which program is completed.

In an erase page search operation, a pass voltage Vpass_S may be applied to the word lines of unselected memory cells. The pass voltage Vpass_S may have a voltage level greater than the maximum possible threshold voltage which a memory cell of the program state P may have.

If the pass voltage Vpass_S is applied, the unselected memory cells may be determined as on cells. That is, if the pass voltage Vpass_S is applied, regardless of whether the unselected memory cells have threshold voltages of the erase state E or threshold voltages of the program state P, the unselected memory cells may be turned on such that cell currents flowing through cell strings may pass through the unselected memory cells.

In the erase page search operation, a search voltage Vsrch_S having a voltage level between the threshold voltages of the erase state E and the program state P may be applied to the word line of a selected memory cell. If the search voltage Vsrch_S is applied, a memory cell having a threshold voltage of the erase state E may be determined as an on cell which stores data "1," and a memory cell having a threshold voltage of the program state P may be determined as an off cell which stores data "0."

The search voltage Vsrch_S may be set to have a voltage level which is greater than the greatest threshold voltage which a memory cell of the erase state E may have, that is, an erase state limit voltage Vlm_E, and which is less than the least threshold voltage which a memory cell of the program state P may have, that is, the program verify voltage Vvf_P.

Referring to FIG. 4, multi-level cells each capable of storing two data bits may be erased to have threshold voltages of an erase state E, and may be programmed to have threshold voltages of any one among a plurality of program states P1, P2 and P3.

In a read operation, any one of a first read voltage Vrd_P1 having a voltage level between the erase state E and a first program state P1, a second read voltage Vrd_P2 having a voltage level between the first program state P1 and a second program state P2 and a third read voltage Vrd_P3 having a voltage level between the second program state P2 and a third program state P3 may be applied to a selected memory cell.

If, for example, the second read voltage Vrd_P2 is applied, memory cells having threshold voltages of the erase state E and the first program state P1 may be determined as on cells which store least significant bit (LSB) data "1," and memory cells having threshold voltages of the second program state P2 and the third program state P3 may be determined as off cells which store LSB data "0".

If the first read voltage Vrd_P1 is applied, a memory cell having a threshold voltage of the erase state E may be determined as an on cell which stores most significant bit (MSB) data "1," and a memory cell having a threshold voltage of the first program state P1 may be determined as an off cell which stores MSB data "0."

If the third read voltage Vrd_P3 is applied, a memory cell having a threshold voltage of the second program state P2 may be determined as an on cell which stores MSB data "1," and a memory cell having a threshold voltage of the third program state P3 may be determined as an off cell which stores MSB data "0."

In a program operation, in order to determine whether the program is completed, any one of program verify voltages Vvf_P1 Vvf_P2 and Vvf_P3 may be applied to a selected memory cell.

If a first program verify voltage Vvf_P1 is applied to memory cells to be programmed to the first program state P1, a memory cell which has a threshold voltage less than the first program verify voltage Vvf_P1 may be determined as an on cell, that is, a memory cell of which program is not completed, and a memory cell which has a threshold voltage greater than the first program verify voltage Vvf_P1 may be determined as an off cell, that is, a memory cell of which program is completed.

If a second program verify voltage Vvf_P2 is applied to memory cells to be programmed to the second program state P2, a memory cell which has a threshold voltage less than the second program verify voltage Vvf_P2 may be determined as an on cell, that is, a memory cell of which program is not completed, and a memory cell which has a threshold voltage greater than the second program verify voltage Vvf_P2 may be determined as an off cell, that is, a memory cell of which program is completed.

If a third program verify voltage Vvf_P3 is applied to memory cells to be programmed to the third program state P3, a memory cell which has a threshold voltage less than the third program verify voltage Vvf_P3 may be determined as an on cell, that is, a memory cell of which program is not completed, and a memory cell which has a threshold voltage greater than the third program verify voltage Vvf_P3 may be determined as an off cell, that is, a memory cell of which program is completed.

In an erase page search operation, a pass voltage Vpass_M may be applied to the word lines of unselected memory cells, the pass voltage Vpass_M having a voltage level greater than the threshold voltage which a memory cell of the third program state P3 may have. If the pass voltage Vpass_M is applied, the unselected memory cells may be determined as on cells. That is, if the pass voltage Vpass_M is applied, regardless of whether the unselected memory cells have threshold voltages of the erase state E or threshold voltages of the program states P1, P2 and P3, the unselected memory cells may be turned on such that cell currents flowing through cell strings may pass through the unselected memory cells. The pass voltage Vpass_M may be set to have a voltage level which is greater than the greatest threshold voltage of the third program state P3, that is, a third program state limit voltage Vlm_P3. In other words, the pass voltage Vpass_M may be set to have a voltage level which is greater than the limit voltage of a program state (for example, the third program state P3) having a greatest threshold voltage distribution among program states which a memory cell may have.

In the erase page search operation, a search voltage Vsrch_M having a voltage level between the erase state E and the first program state P1 may be applied to the word line of a selected memory cell. If the search voltage Vsrch_M is applied, a memory cell having a threshold voltage of the erase state E may be determined as an on cell which stores data "1," and a memory cell having a threshold voltage of the program states P1, P2 and P3 may be determined as an off cell which stores data "0."

The search voltage Vsrch_M may be set to have a voltage level which is greater than the greatest threshold voltage which a memory cell of the erase state E may have, that is, an erase state limit voltage Vlm_E, and which is less than the least threshold voltage which a memory cell of a program state (for example, the first program state P1) most adjacent to the erase state E may have, that is, the first program verify voltage Vvf_P1.

Figure 5:
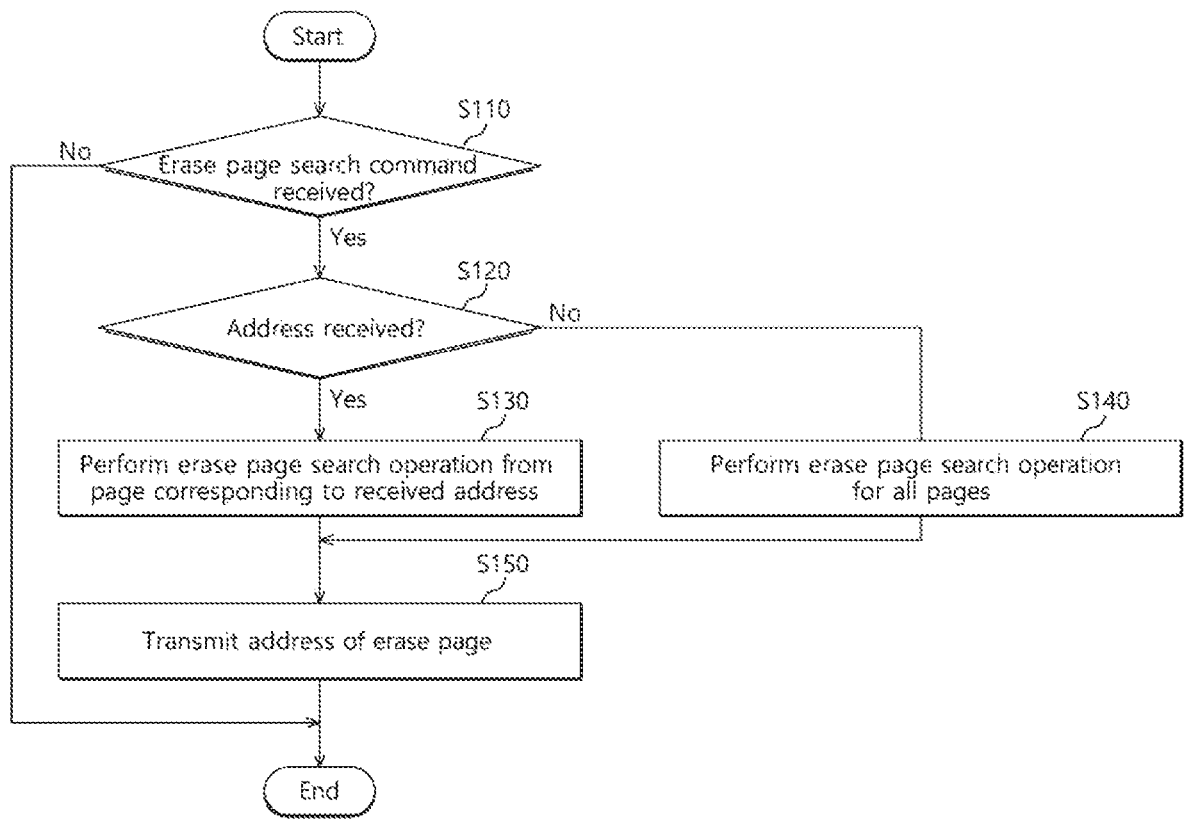
FIG. 5 is a flow chart illustrating an exemplary erase page search operation of a nonvolatile memory device in accordance with an embodiment.
Figure 6:
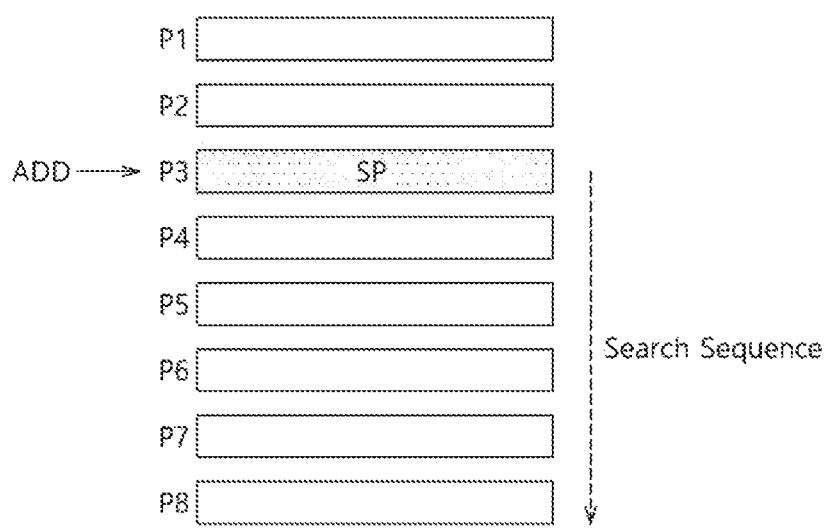
FIGS. 6 to 8 are diagrams illustrating an erase page search method of a nonvolatile memory device in accordance with an embodiment.
Figure 7:
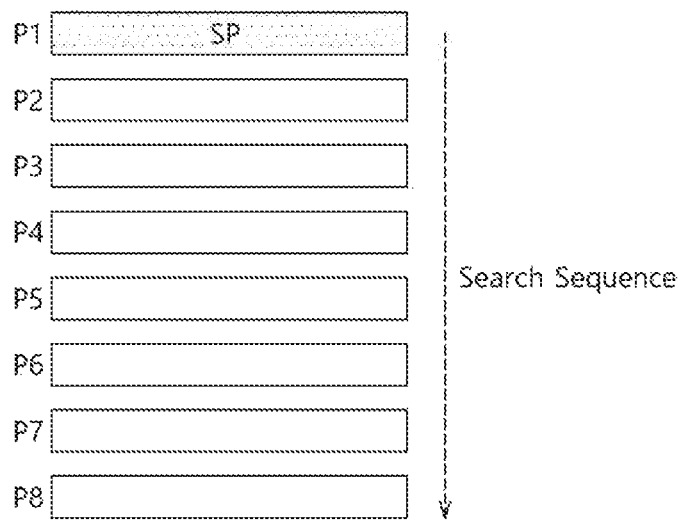
Figure 8:
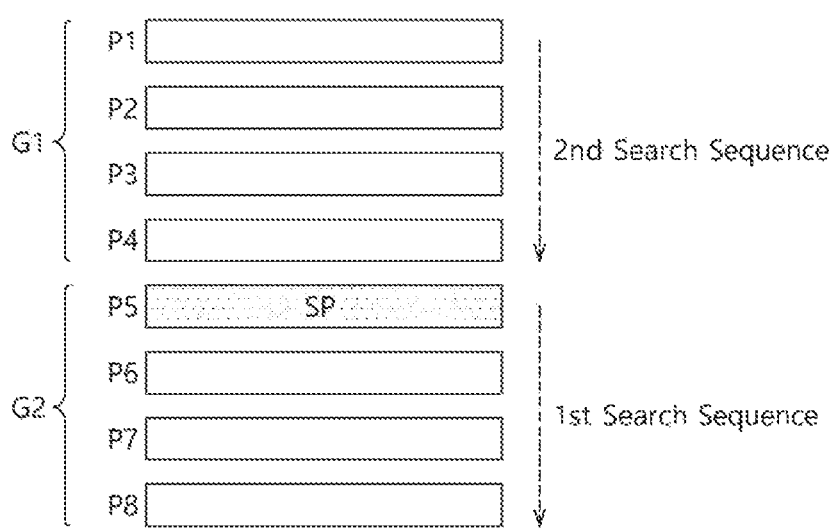

FIG. 5 is a flow chart illustrating an exemplary erase page search operation of a nonvolatile memory device in accordance with an embodiment of the present invention. The nonvolatile memory device may be, for example, the nonvolatile memory device 300 of FIG. 1. FIGS. 6 to 8 are diagrams providing further explanation of erase page search sequences of a nonvolatile memory device in accordance with the described method. For the sake of convenience in explanation, search sequences for eight pages P1 to P8 will be exemplified in FIGS. 6 to 8.

At step S110, the nonvolatile memory device 300 may determine whether an erase page search command is received from the external device, for example, a controller. In the case where an erase page search command is not received, the process may be ended. In the case where an erase page search command is received, the process may proceed to step S120.

At the step S120, the nonvolatile memory device 300 may determine whether an address is received from the controller. The controller may predict an erase page by various algorithms and may transmit the address of a predicted erase page, along with the erase page search command. If it is determined that the address is received from the controller, the nonvolatile memory device 300 may perform step S130. If the controller does not predict an erase page, the controller may only transmit the erase page search command. In that case, when it is determined that the address is not received from the controller, the nonvolatile memory device 300 may perform step S140.

At step S130, the nonvolatile memory device 300 may perform an erase page search operation from a page corresponding to a received address. For instance, as shown in FIG. 6, the nonvolatile memory device 300 may set a third page P3 corresponding to a received address ADD, as an initial search page SP, and determine whether the third page P3 is in an erase state. If it is determined that the third page P3 is not an erase page, the nonvolatile memory device 300 may change the search page SP according to a predetermined method or page sequence, and repeatedly perform the erase page search operation until an erase page is found.

At the step S140, the nonvolatile memory device 300 may perform an erase page search operation according to a predetermined search sequence.

For instance, the nonvolatile memory device 300 may perform the erase page search operation from a page which is fastest, or first in a page sequence. For example, referring to FIG. 7, the nonvolatile memory device 300 may set a first page P1 which is fastest in the page sequence, as an initial search page SP, and determine whether the first page P1 is in an erase state. If it is determined that the first page P1 is not in an erase page, the nonvolatile memory device 300 may change the search page SP according to the page sequence, and repeatedly perform the erase page search operation until an erase page is found.

For another instance, the nonvolatile memory device 300 may divide all pages into at least two groups, and search any one group first and then search the other group when an erase page is not searched in the first searched group. For example, referring to FIG. 8, the nonvolatile memory device 300 may divide all the pages P1 to P8 into two groups G1 and G2, and perform the erase page search operation for the pages of the second group G2 as a first search sequence. The nonvolatile memory device 300 may set a fifth page P5 which is fastest in a page sequence in the second group G2, as an initial search page SP, and determine whether the fifth page P5 is an erase state. If it is determined that the fifth page P5 is not an erase page, the nonvolatile memory device 300 may change the search page SP according to the page sequence in the second group G2, and repeatedly perform the erase page search operation until an erase page is found. If an erase page is not searched in the second group G2, the nonvolatile memory device 300 may perform the erase page search operation for the remaining first group G1 as a second search sequence. Alternatively, the first group G1 may be the first search sequence, and the second group G2 may be the second search sequence.

Referring again to FIG. 5, at step S150, the nonvolatile memory device 300 may transmit the address of an erase page to the controller. For instance, the nonvolatile memory device 300 may transmit the address of a searched erase page to the controller when a status command is transmitted from the controller.

Figure 9:
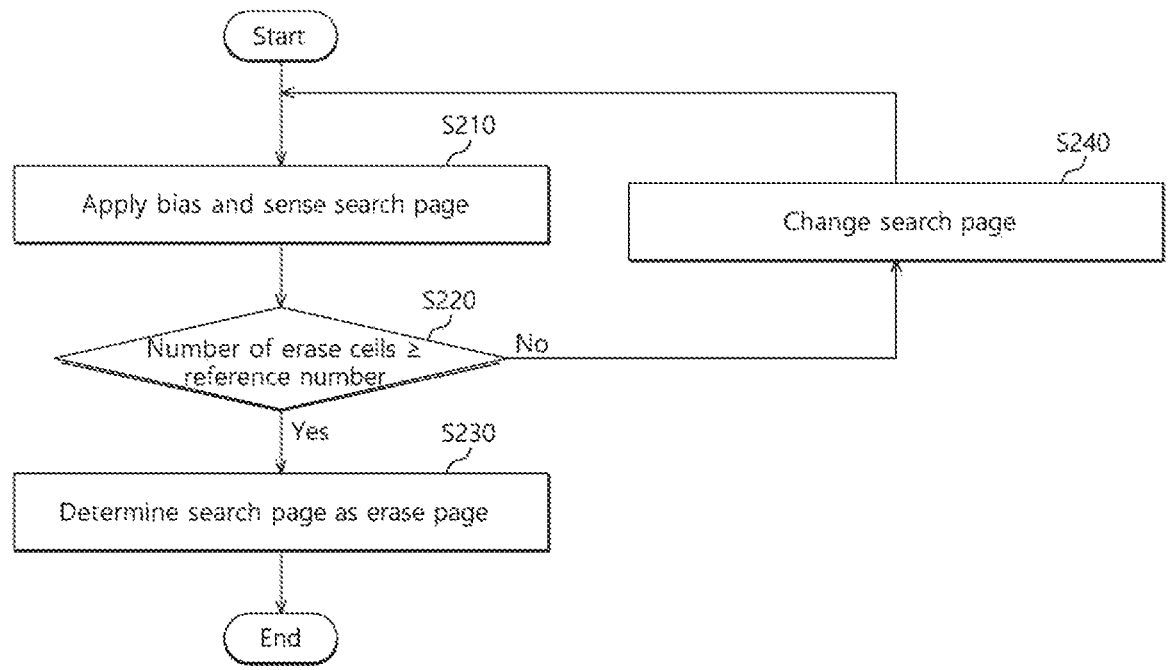
FIG. 9 is a flow chart illustrating a step of performing an erase page search operation in accordance with an embodiment.
Figure 10:
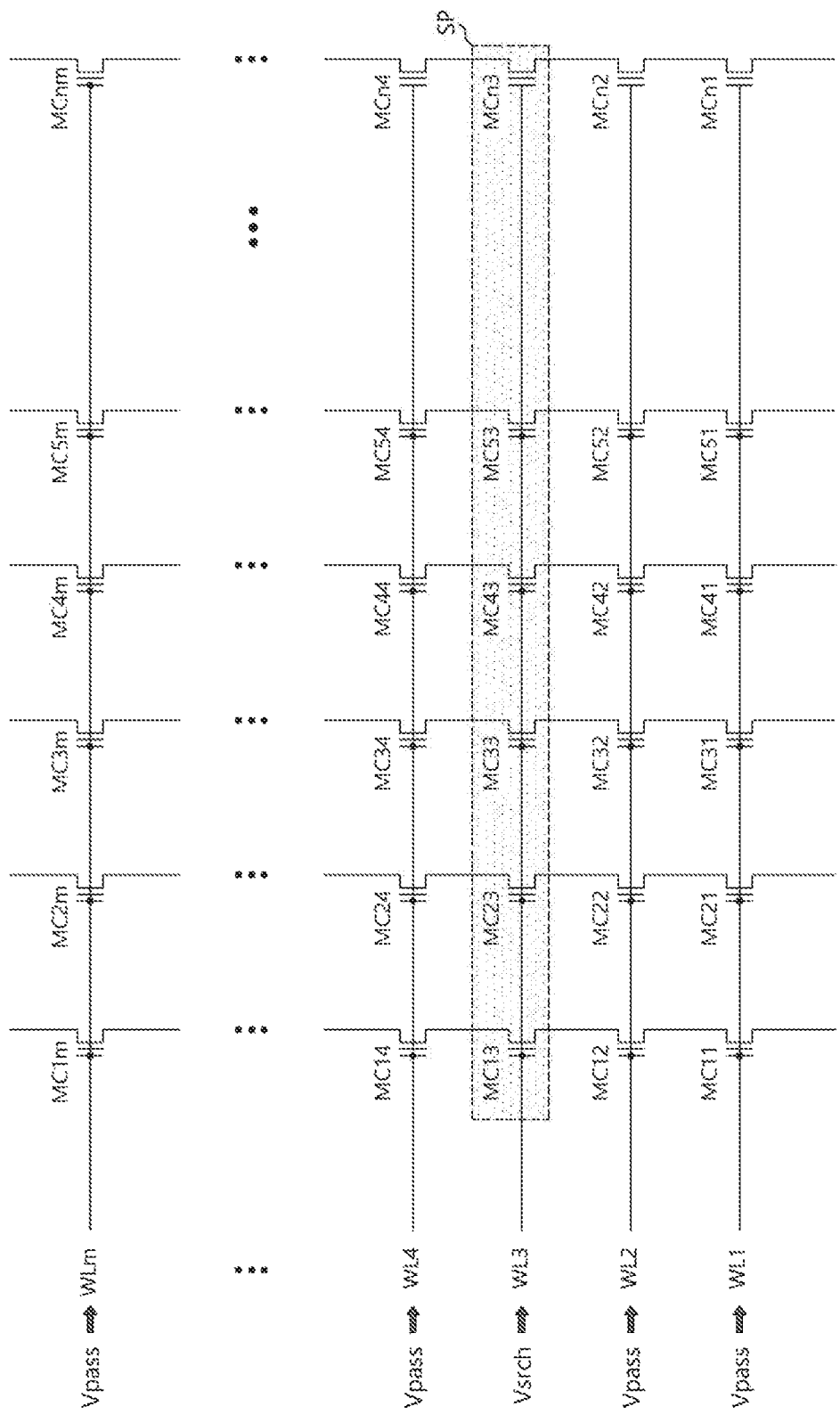
FIG. 10 is a diagram illustrating a bias condition of an erase page search operation in accordance with an embodiment.

FIG. 9 is a flow chart illustrating a step of performing an erase page search operation in accordance with an embodiment, for example, the step S130 of performing the erase page search operation of FIG. 5. FIG. 10 is a diagram illustrating a bias condition of an erase page search operation in accordance with an embodiment.

At step S210, a bias may be applied to the memory cell region 310, and a search page may be sensed. For instance, as shown in FIG. 10, a search voltage Vsrch may be applied to the word line WL3 of a selected page (that is, the search page SP), and a pass voltage Vpass may be applied to word lines WL1, WL2 and WL4 to WLm of unselected pages. A sensing operation for the search page SP may be performed by the data read/write block 330. The sensing operation may be performed in the same manner as a sensing operation which is performed during a general read operation.

At step S220, it may be determined whether the number of erase cells of the search page SP is equal to or greater than the reference number. An erase cell may mean a memory cell which is determined as an on cell as the search voltage Vsrch is applied. For instance, the operations of counting the number of erase cells and comparing the number of erase cells and the reference number may be performed by the control logic 360.

In the case where the number of erase cells is equal to or greater than the reference number (S220, Yes), as in step S230, a current search page may be determined as an erase page.

Conversely, in the case where the number of erase cells is less than the reference number (S220, No), as in step S240, the search page SP may be changed and a new page is selected as the search page. Namely, in the case where the number of erase cells is less than the reference number, any one among the remaining pages except the current search page is selected again as the search page SP, and the steps S210 and S220 may be repeatedly performed until an erase page is found.

Figure 11:
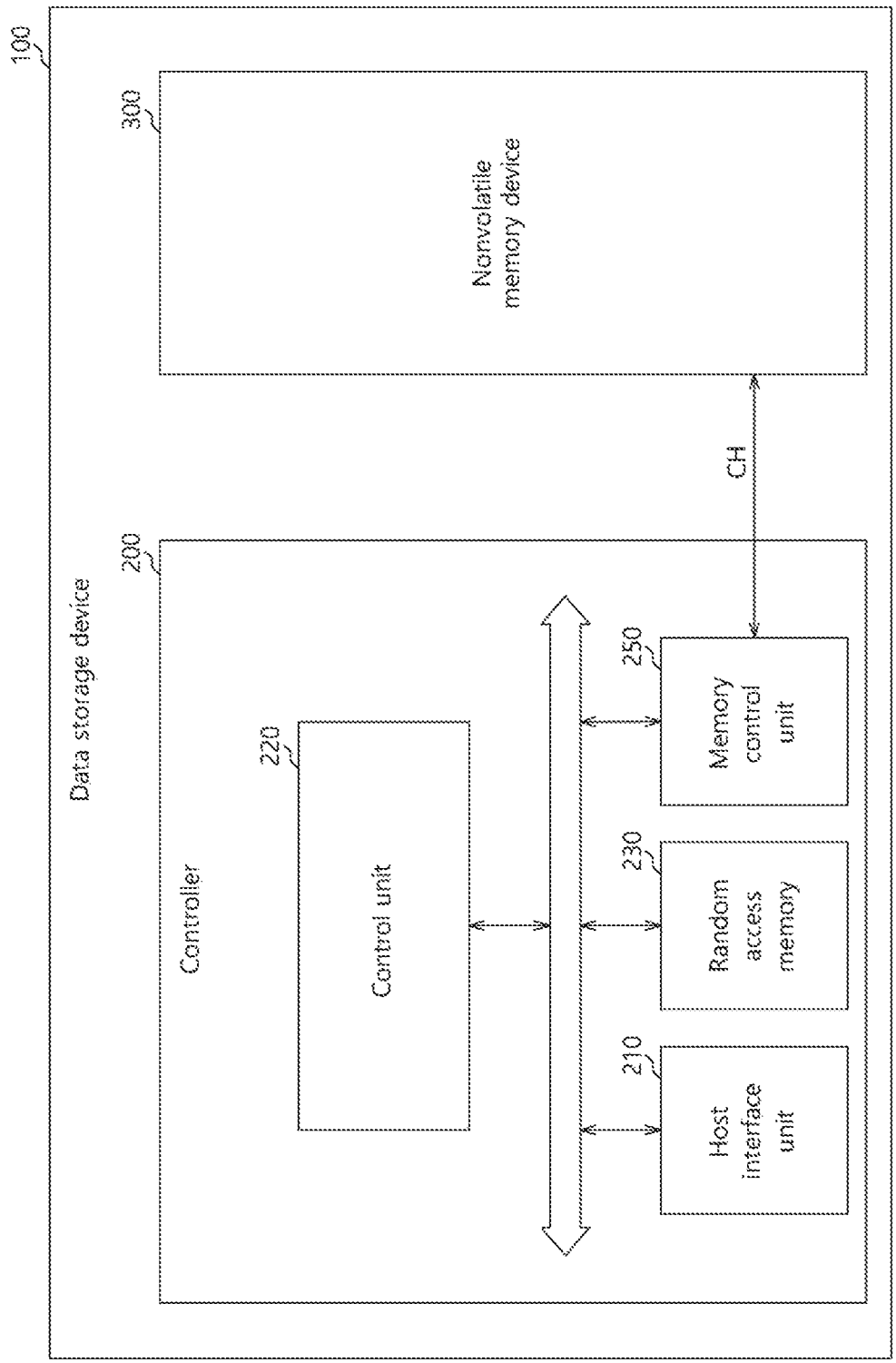
FIG. 11 is simplified block diagram illustrating a data storage device including a nonvolatile memory device in accordance with an embodiment.

FIG. 11 is simplified block diagram illustrating a data storage device 100 including a nonvolatile memory device 300 in accordance with an embodiment. The data storage device 100 may store data to be accessed by a host device (not shown) such as a mobile phone, an MP3 player, a laptop computer, a desktop computer, a game player, a television (TV), an in-vehicle infotainment system, and so forth. The data storage device 100 may be referred to as a memory system.

The data storage device 100 may be manufactured as any one of various kinds of storage devices according to a host interface meaning a transmission protocol with respect to the host device. For example, the data storage device 100 may be configured as any one of various kinds of storage devices such as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCIe) card type storage device, a compact flash (CF) card, a smart media card, a memory stick, and so forth.

The data storage device 100 may be manufactured as any one among various kinds of packages, such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

The data storage device 100 may include a controller 200 and the nonvolatile memory device 300 operably coupled to each other via at least one communication channel CH. The controller 200 may include a host interface unit 210, a control unit 220, a random access memory 230, and a memory control unit 250 all operably coupled to an internal bus.

The host interface unit 210 may interface the host device and the data storage device 100. For example, the host interface unit 210 may communicate with the host device by using any one among standard transmission protocols such as universal serial bus (USB), universal flash storage (UFS), multimedia card (MMC), parallel advanced technology attachment (PATA), serial advanced technology attachment (SATA), small computer system interface (SCSI), serial attached SCSI (SAS), peripheral component interconnection (PCI) and PCI express (PCIe) protocols.

The control unit 220 may be configured by a micro control unit (MCU) or a central processing unit (CPU). The control unit 220 may process a request which is received from the host device. In order to process the request, the control unit 220 may drive an instruction or algorithm of a code type, that is, a firmware (FW), loaded in the random access memory 230, and may control the internal function blocks 210, 230 and 250 or a nonvolatile memory device 300.

The random access memory 230 may be configured by a random access memory such as a dynamic random access memory (DRAM) or a static random access memory (SRAM). The random access memory 230 may store the firmware FW which is to be driven by the control unit 220. Also, the random access memory 230 may store data necessary for driving of the firmware FW, for example, metadata. That is, the random access memory 230 may operate as the working memory of the control unit 220.

The memory control unit 250 may control the nonvolatile memory device 300 according to the control of the control unit 220. The memory control unit 250 may also be referred to as a memory interface unit. The memory control unit 250 may provide control signals to the nonvolatile memory device 300. The control signals may include a command, an address, a control signal and so forth for controlling the nonvolatile memory device 300. The memory control unit 250 may provide data to the nonvolatile memory device 300 or may be provided with the data read out from the nonvolatile memory device 300.

The data storage device 100 may include the nonvolatile memory device 300 of FIG. 1. The nonvolatile memory device 300 may be coupled with the controller 200 through a channel CH which includes at least one signal line capable of transmitting a command, an address, control signals and data. The nonvolatile memory device 300 may be used as the storage medium of the data storage device 100.

The nonvolatile memory device 300 may be configured by any one of various types of nonvolatile memory devices such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PCRAM) using a chalcogenide alloy, and a resistive random access memory (RERAM) using a transition metal oxide.

Figure 12:
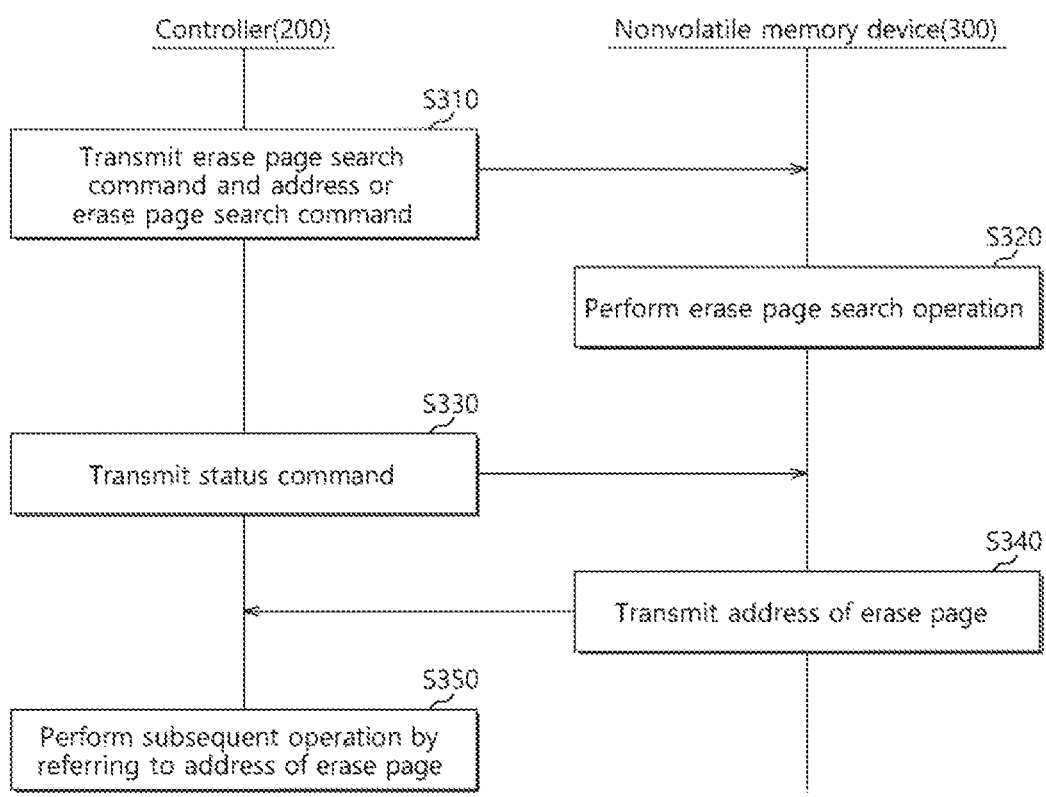
FIG. 12 is a flow chart illustrating an operation of a data storage device in accordance with an embodiment.

FIG. 12 is a flow chart illustrating an operation of a data storage device in accordance with an embodiment. With reference to FIG. 12, descriptions will be made for the operation of a nonvolatile memory device 300 which searches an erase page by itself according to an erase page search command received from a controller 200.

At step S310, the controller 200 may transmit an erase page search command and an address together or only an erase page search command, to the nonvolatile memory device 300. In some embodiments, the address may indicate a region for search, among a plurality of pages.

At step S320, the nonvolatile memory device 300 may perform an erase page search operation according to the erase page search command. That is to say, the nonvolatile memory device 300 may search an erased page among the pages of the memory cell region 310. For instance, in the case where an erase page search command and an address are received together, the nonvolatile memory device 300 may perform an erase page search operation from a page corresponding to the received address, as described above with reference to FIG. 6. For another instance, in the case where only an erase page search command is received, the nonvolatile memory device 300 may perform an erase page search operation according to a predetermined search sequence, as described above with reference to FIGS. 7 and 8.

At step S330, the controller 200 may transmit a status command to the nonvolatile memory device 300.

At step S340, the nonvolatile memory device 300 may transmit information regarding the address of a searched erase page to the controller 200 according to the status command.

At step S350, the controller 200 may perform a subsequent operation by referring to the address of the erase page. For example, in the case where recovery is made from a sudden power-off state to a normal state, the controller 200 may perform an error handling operation for a program operation performed last by the nonvolatile memory device 300, by referring to the address of the erase page.

Figure 13:
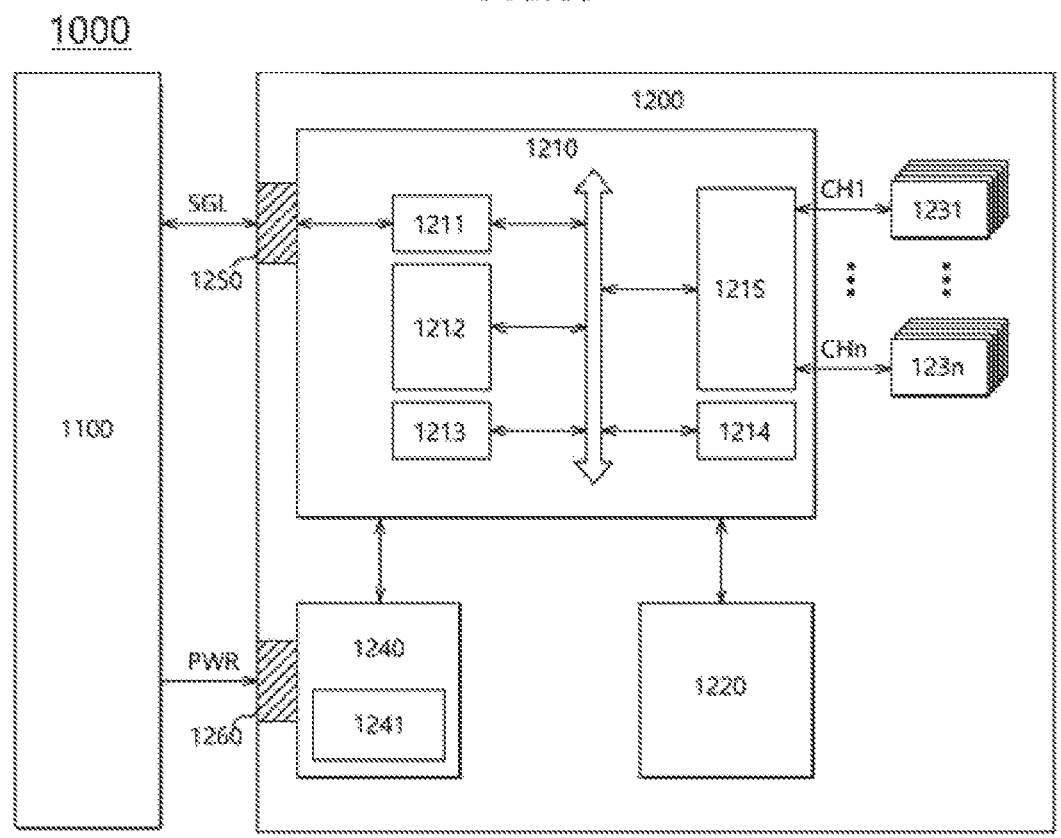
FIG. 13 is a diagram illustrating a representation of an example of a data processing system including a solid state drive in accordance with an embodiment.

FIG. 13 is a diagram illustrating a representation of an example of a data processing system 1000 including a solid state drive (SSD) in accordance with an embodiment. Referring to FIG. 13, the data processing system 1000 may include a host device 1100 and the SSD 1200.

The SSD 1200 may include a controller 1210, a buffer memory device 1220, at least one of nonvolatile memory devices 1231 to 123n, a power supply 1240, a signal connector 1250, and a power connector 1260.

The controller 1210 may control general operations of the SSD 1200. The controller 1210 may include a host interface unit 1211, a control unit 1212, a random access memory 1213, an error correction code (KC) unit 1214, and a memory interface unit 1215.

The host interface unit 1211 may exchange a signal SGL with the host device 1100 through the signal connector 1250. The signal SGL may include a command, an address, data, and so forth. The host interface unit 1211 may interface the host device 1100 and the SSD 1200 according to the protocol of the host device 1100. For example, the host interface unit 1211 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (TATA), serial advanced technology attachment (SATA), small computer system interface (SCSI), serial attached SCSI (SAS), peripheral component interconnection (PCI), PCI express (PCI-e) and universal flash storage (UFS).

The control unit 1212 may analyze and process the signal SGL received from the host device 1100. The control unit 1212 may control operations of internal function blocks according to a firmware or a software for driving the SSD 1200. The random access memory 1213 may be used as a working memory for driving such a firmware or software.

The ECC unit 1214 may generate the parity data of data to be transmitted to at least one of the nonvolatile memory devices 1231 to 123n. The generated parity data may be stored together with the data in the nonvolatile memory devices 1231 to 123n. The ECC unit 1214 may detect an error of the data read from at least one of the nonvolatile memory devices 1231 to 123n, based on the parity data. If a detected error is within a correctable range, the ECC unit 1214 may correct the detected error.

The memory interface unit 1215 may provide control signals such as commands and addresses to at least one of the nonvolatile memory devices 1231 to 123n, according to control of the control unit 1212. Moreover, the memory interface unit 1215 may exchange data with at least one of the nonvolatile memory devices 1231 to 123n, according to control of the control unit 1212. For example, the memory interface unit 1215 may provide the data stored in the buffer memory device 1220, to at least one of the nonvolatile memory devices 1231 to 123n, or provide the data read from at least one of the nonvolatile memory devices 1231 to 123n, to the buffer memory device 1220.

The buffer memory device 1220 may temporarily store data in at least one of the nonvolatile memory devices 1231 to 123n. Further, the buffer memory device 1220 may temporarily store the data read from at least one of the nonvolatile memory devices 1231 to 123n. The data temporarily stored in the buffer memory device 1220 may be transmitted to the host device 1100 or at least one of the nonvolatile memory devices 1231 to 123n according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 14:
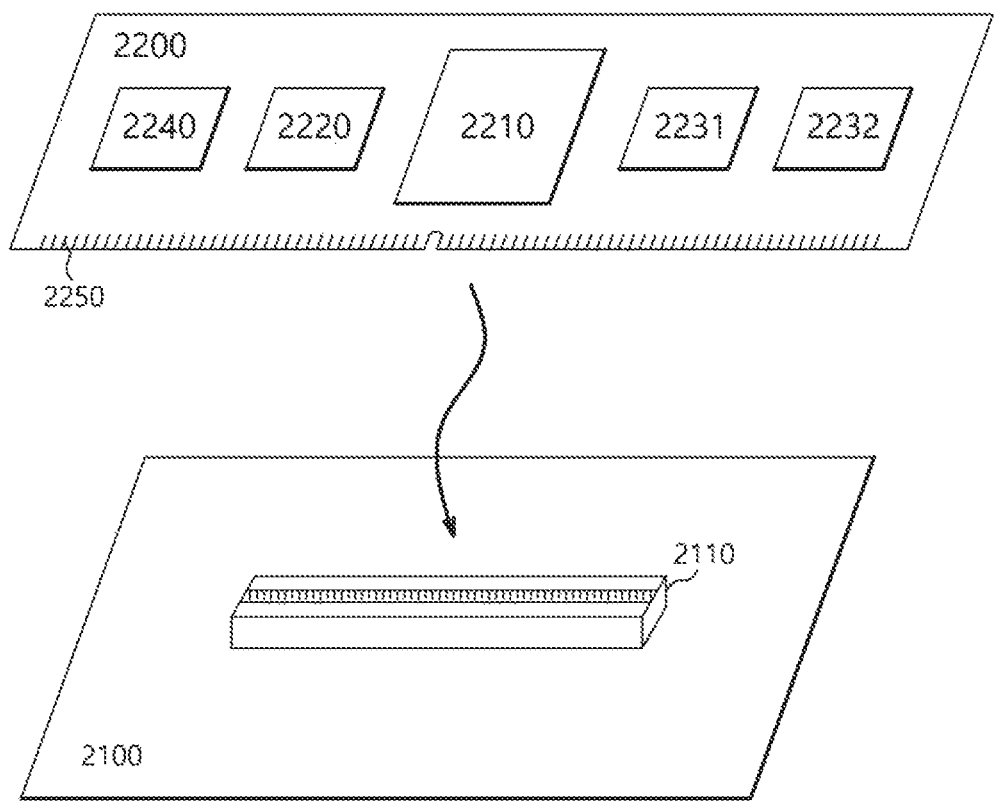
FIG. 14 is a diagram illustrating a representation of an example of a data processing system including a data storage device in accordance with an embodiment.

FIG. 14 is a diagram illustrating a representation of an example of a data processing system 2000 including a data storage device 2200 in accordance with an embodiment. Referring to FIG. 14, the data processing system 2000 may include a host device 2100 and the data storage device 2200.

The host device 2100 may be configured in the form of a board such as a printed circuit board. Although not shown, the host device 2100 may include internal function blocks for performing the function of a host device.

The host device 2100 may include a connection terminal 2110 such as a socket, a slot or a connector. The data storage device 2200 may be mounted to the connection terminal 2110.

The data storage device 2200 may be configured in the form of a board such as a printed circuit board. The data storage device 2200 may be referred to as a memory module or a memory card. The data storage device 2200 may include a controller 2210, a buffer memory device 2220, nonvolatile memory devices 2231 and 2232, a power management integrated circuit (PMIC) 2240, and a connection terminal 2250.

The controller 2210 may control general operations of the data storage device 2200. The controller 2210 may be configured in the same manner as the controller 1210 shown in FIG. 13.

The buffer memory device 2220 may temporarily store data in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the data storage device 2200.

The PMIC 2240 may provide the power inputted through the connection terminal 2250, to the inside of the data storage device 2200. The PMIC 2240 may manage the power of the data storage device 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the data storage device 2200. The connection terminal 2250 may be configured into various types depending on an interface scheme between the host device 2100 and the data storage device 2200. The connection terminal 2250 may be disposed on any one side of the data storage device 2200.

Figure 15:
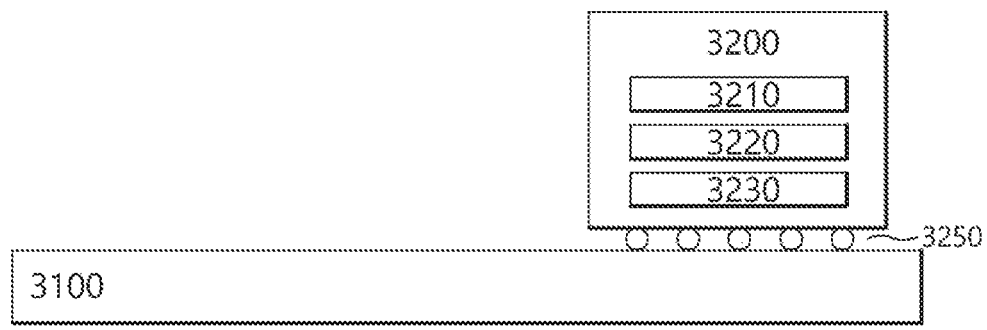
FIG. 15 is a diagram illustrating a representation of an example of a data processing system including a data storage device in accordance with an embodiment.

FIG. 15 is a diagram illustrating a representation of an example of a data processing system 3000 including a data storage device 3200 in accordance with an embodiment. Referring to FIG. 15, the data processing system 3000 may include a host device 3100 and the data storage device 3200.

The host device 3100 may be configured in the form of a board such as a printed circuit board. Although not shown, the host device 3100 may include internal function blocks for performing the function of a host device.

The data storage device 3200 may be configured in the form of a surface-mounting type package. The data storage device 3200 may be mounted to the host device 3100 through solder balls 3250. The data storage device 3200 may include a controller 3210, a buffer memory device 3220, and a nonvolatile memory device 3230.

The controller 3210 may control general operations of the data storage device 3200. The controller 3210 may be configured in the same manner as the controller 1210 shown in FIG. 13.

The buffer memory device 3220 may temporarily store data in the nonvolatile memory device 3230. Further, the buffer memory device 3220 may temporarily store the data read from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the data storage device 3200.

Figure 16:
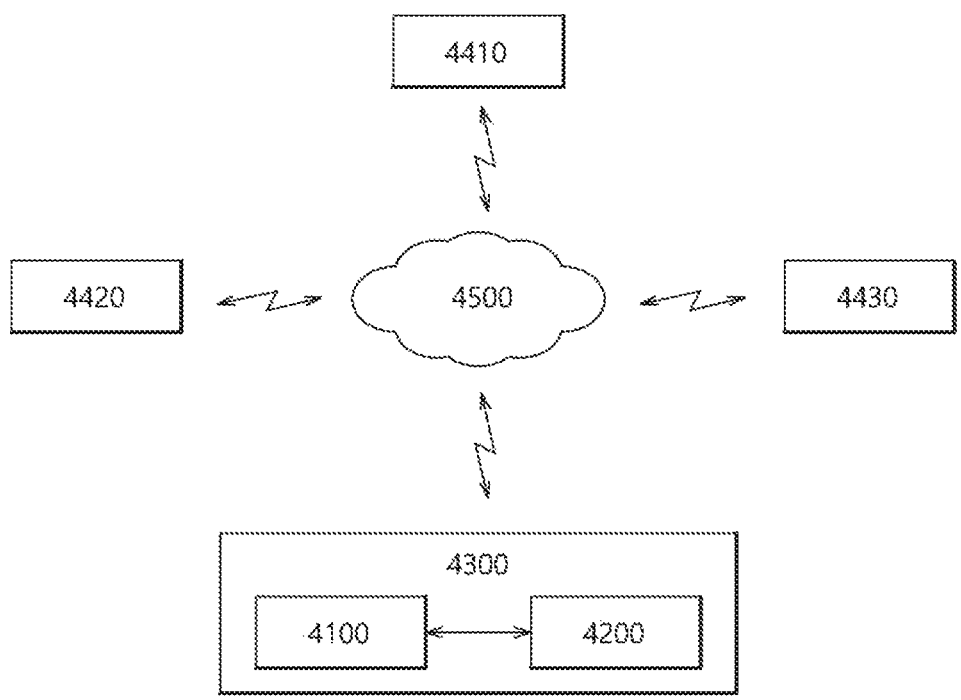
FIG. 16 is a diagram illustrating a representation of an example of a network system including a data storage device in accordance with an embodiment.

FIG. 16 is a diagram illustrating a representation of an example of a network system 4000 including a data storage device in accordance with an embodiment. Referring to FIG. 16, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the data storage device 4200. The data storage device 4200 may be configured as the data storage device 100 shown in FIG. 11, the data storage device 1200 shown in FIG. 13, the data storage device 2200 shown in FIG. 14 or the data storage device 3200 shown in FIG. 15.

While the present invention has been described in reference to various specific embodiments, it will be understood by those skilled in the art of the present invention that the described embodiments are only examples of the present invention. Accordingly, the present invention should not be limited only to the described embodiments and many other embodiments may be envisioned by those skilled in the art of the present invention after having read the present disclosure without departing from the scope of the present invention as defined by the following claims.

What is claimed is:

1. A data storage device comprising:
   a controller suitable for transmitting a search command; and
   a nonvolatile memory device suitable for:
      dividing a plurality of pages into at least a first group and a second group,
      performing an erase page search operation first for pages of the first group prior to pages of the second group, and
      transmitting information regarding a searched page to the controller.

2. The data storage device according to claim 1, wherein the nonvolatile memory device performs the erase page search operation for pages of the second group when an erase page is not searched in the first group.

3. The data storage device according to claim 1, wherein the nonvolatile memory device sets a page which is first in a predetermined search sequence in the first group, as an initial search page, and performs the erase page search operation for the initial search page.

4. The data storage device according to claim 3, wherein, when it is determined that the initial search page is not the erase page, the nonvolatile memory device selects a new search page according to the predetermined search sequence in the group, and performs the erase page search operation for the new search page.

5. The data storage device according to claim 1, wherein the controller transmits additionally a status command such that the nonvolatile memory device transmits the information regarding the page searched as the erase page.

\* \* \* \* \*